(12) United States Patent
Haneda et al.

(10) Patent No.: US 8,876,274 B2
(45) Date of Patent: Nov. 4, 2014

(54) PATTERN FORMING METHOD

(75) Inventors: Yuya Haneda, Nagano (JP); Ryoichi Nozawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 344 days.

(21) Appl. No.: 13/429,549

(22) Filed: Mar. 26, 2012

(65) Prior Publication Data

US 2012/0249664 A1      Oct. 4, 2012

(30) Foreign Application Priority Data

Mar. 30, 2011   (JP) ................................ 2011-075818

(51) Int. Cl.
| | |
|---|---|
| C09D 11/00 | (2014.01) |
| C09D 11/30 | (2014.01) |
| B41J 2/14 | (2006.01) |
| C09D 11/101 | (2014.01) |
| H05K 1/02 | (2006.01) |
| B41M 5/00 | (2006.01) |
| B41M 7/00 | (2006.01) |
| B41M 3/00 | (2006.01) |

(52) U.S. Cl.
CPC .............. *B41J 2/14274* (2013.01); *C09D 11/30* (2013.01); *B41M 5/0023* (2013.01); *H05K 2201/09936* (2013.01); *B41M 7/0081* (2013.01); *H05K 2203/013* (2013.01); *B41M 3/008* (2013.01); *C09D 11/101* (2013.01); *B41M 5/007* (2013.01); *H05K 1/0266* (2013.01); *B41M 5/0011* (2013.01); *B41M 5/0047* (2013.01); *B41M 5/0041* (2013.01)
USPC ........................................................ 347/100

(58) Field of Classification Search
USPC ......................................................... 347/100
See application file for complete search history.

(56) References Cited

U.S. PATENT DOCUMENTS

| | | | |
|---|---|---|---|
| 6,846,073 B2 | | 1/2005 | Yamamoto et al. |
| 7,748,837 B2 | | 7/2010 | Kremers |
| 2003/0179270 A1 | * | 9/2003 | Yamamoto et al. ........... 347/102 |
| 2004/0207705 A1 | | 10/2004 | Ozawa |
| 2006/0203057 A1 | * | 9/2006 | Lauw et al. .................... 347/100 |
| 2010/0112497 A1 | | 5/2010 | Takabayashi et al. |

FOREIGN PATENT DOCUMENTS

| | | | | | |
|---|---|---|---|---|---|
| JP | 60-153669 | A | | 8/1985 | |
| JP | 11-042799 | A | | 2/1999 | |
| JP | 11-277725 | A | | 10/1999 | |
| JP | 2002-144555 | A | | 5/2002 | |
| JP | 2003-080687 | A | | 3/2003 | |
| JP | 2004182933 | A | * | 7/2004 | ............ C09D 11/00 |
| JP | 2005-119243 | A | | 5/2005 | |
| JP | 2007-125804 | A | | 5/2007 | |
| JP | 2007-125886 | A | | 5/2007 | |
| JP | 3912075 | B2 | | 5/2007 | |
| JP | 2007-160784 | A | | 6/2007 | |
| JP | 2007-246727 | A | | 9/2007 | |
| JP | 2007-268788 | A | | 10/2007 | |

(Continued)

*Primary Examiner* — Laura Martin
(74) *Attorney, Agent, or Firm* — Global IP Counselors, LLP

(57) ABSTRACT

A pattern forming method includes: performing a first droplet ejection step by ejecting droplets containing 0.1%-2% polysiloxane by mass onto a substrate; performing a first layer forming step by solidifying the droplets ejected onto the substrate so that a first layer is formed; performing a second droplet ejection step by ejecting more droplets over the first layer; and performing a second layer forming step by solidifying the droplets ejected onto the first layer so that a second layer is formed.

7 Claims, 9 Drawing Sheets

(56) References Cited

FOREIGN PATENT DOCUMENTS

| | | |
|---|---|---|
| JP | 2007-313839 A | 12/2007 |
| JP | 2008-126599 A | 6/2008 |
| JP | 2008-170697 A | 7/2008 |
| JP | 2008-170822 A | 7/2008 |
| JP | 2008-188826 A | 8/2008 |
| JP | 2009-028909 A | 2/2009 |
| JP | 2009-084350 A | 4/2009 |
| JP | 2009-234242 A | 10/2009 |
| JP | 2009-242468 A | 10/2009 |
| JP | 2009-263603 A | 11/2009 |
| JP | 2010-000691 A | 1/2010 |
| JP | 2010-024296 A | 2/2010 |
| JP | 2010-131975 A | 6/2010 |
| JP | 2010-195878 A | 9/2010 |
| WO | WO-03/080344 A1 | 10/2003 |

* cited by examiner

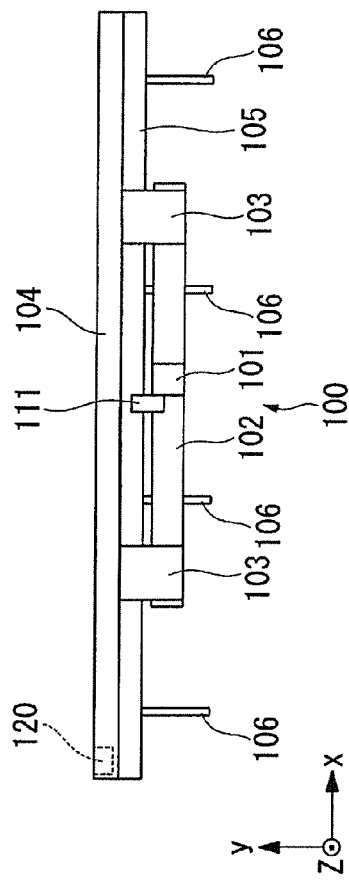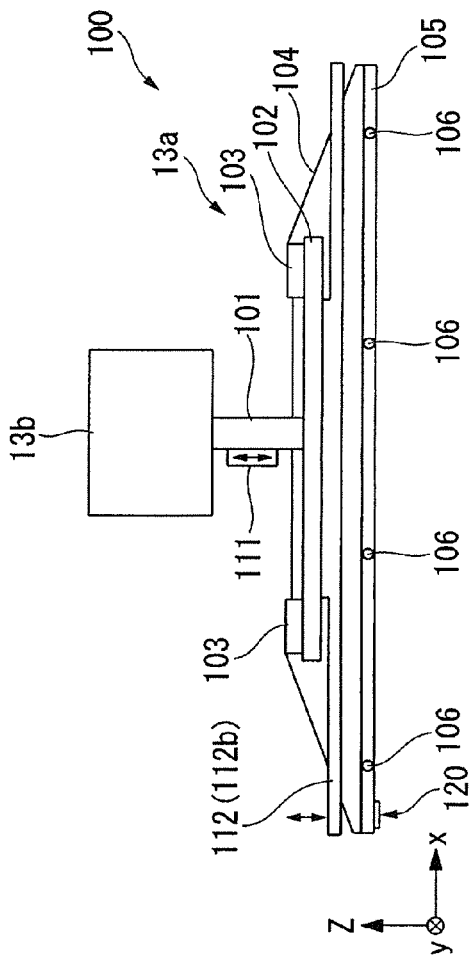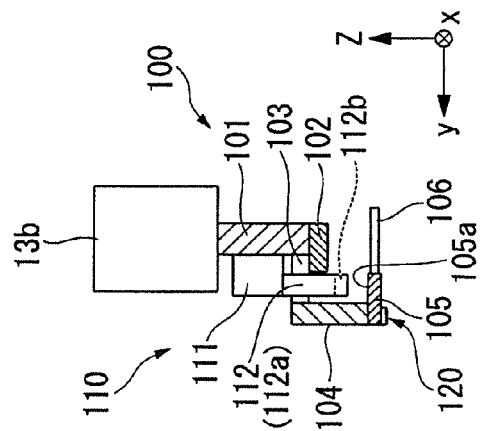

(a) 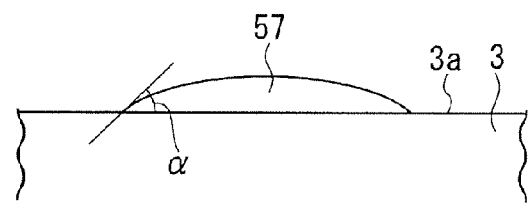
(b) 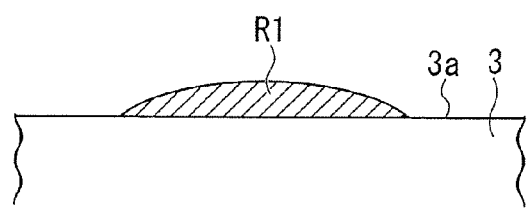
(c) 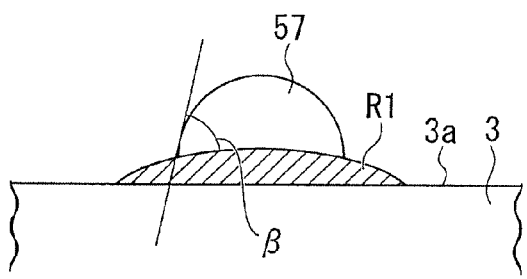
(d) 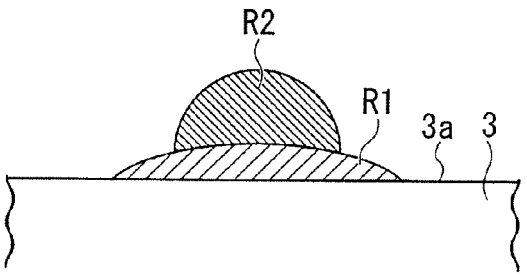
(e) 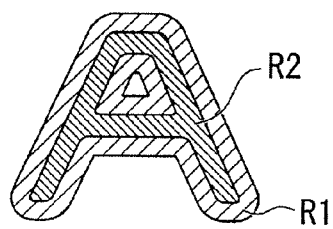
Fig. 10

PATTERN FORMING METHOD

CROSS-REFERENCE TO RELATED APPLICATIONS

This application claims priority to Japanese Patent Application No. 2011-075818 filed on Mar. 30, 2011. The entire disclosure of Japanese Patent Application No. 2011-075818 is hereby incorporated herein by reference.

BACKGROUND

1. Technical Field

The present invention relates to a pattern forming method.

2. Related Art

In recent years, droplet-ejecting apparatus that form an image or pattern on a recording medium using UV-curable ink, which cures upon irradiation with ultraviolet light, have been receiving attention. UV-curable ink, which dries extremely slowly until irradiated with ultraviolet light, at which point it rapidly cures, has properties favorable for use as a printer ink. Because no solvent is evaporated when it cures, this type of ink also has the advantage of placing little burden upon on the environment.

UV-curable ink also demonstrates high bondability to a variety of recording media depending on vehicle composition. It also possesses many superior properties, such as chemical stability after curing, adhesiveness, chemical resistance, weather resistance, friction resistance, and the ability to withstand outdoor environments. For this reason, along with thin, sheet-like recording media such as paper, resin film, metal foil, and the like, UV ink can also form images on materials with surfaces having some degree of three-dimensionality, such as recording media labels, textile products, and the like. Techniques are known in which a droplet ejection method is used to print attribute information such as manufacturing number and manufacturer on an IC on a substrate using a UV-curable ink as described above (see, for example, Japanese Laid-Open Patent Application Publication No. 2003-080687).

SUMMARY

However, the following problem is present in the above described prior art.

In recent years, ICs have become progressively smaller and thinner. For this reason, the ability to form highly visible, fine patterns is sought.

In light of the above circumstances, the present invention has as an object thereof the provision of a pattern forming method capable of forming highly visible, fine patterns.

The pattern forming method according to one aspect of the present invention includes a first droplet ejection step of ejecting droplets containing 0.1%-2% polysiloxane by mass onto a substrate, a first layer forming step of solidifying the droplets ejected upon the substrate so that a first layer is formed, a second droplet ejection step of ejecting more droplets over the first layer, and a second layer forming step of solidifying the droplets ejected upon the first layer so that a second layer is formed.

Because the droplets of the present invention include 0.1%-2% by mass of polysiloxane, the contact angle of the first layer and the droplet ejected thereupon is greater than the contact angle of the substrate and the droplets ejected thereupon. For this reason, it is possible to prevent the second layer from spreading over the first layer when forming, and to form a second layer that is finer than the first layer. Because the first layer and second layer can be formed three-dimensionally, it is possible to form highly visible, fine patterns.

In the above pattern forming method, the HLB value of the polysiloxane is preferably from 5 to 12.

Because the HLB value of the polysiloxane in the present invention is from 5 to 12, it is possible to more reliably ensure that the contact angle of the first layer and the droplets ejected thereupon is greater than the contact angle of the substrate and the droplets ejected thereupon.

In the above pattern forming method, it is preferable that the second droplet ejection step include eject the droplets so as not to protrude from over the first layer.

Because the droplets of the present invention are ejected so as not to protrude from over the first layer, it is possible to form fine patterns with high visibility.

In the pattern forming method, it is preferable that the droplets include a component that solidifies under active light, and that the first layer forming step and second layer forming step include irradiating the droplets with the active light.

Because effective solidification of the droplets ejected onto the substrate within the present invention is possible, reductions in the size and price of an apparatus are aided.

In the above pattern forming method, it is preferable that the active light be ultraviolet light.

Because effective curing of the droplets ejected onto the substrate within the present invention is possible, reductions in apparatus size and price are enabled.

In the above pattern forming method, it is preferable that the substrate be a semiconductor substrate having a semiconductor device, and that the first droplet ejection step include ejecting droplets upon the semiconductor device.

When forming a layered pattern composed of a first layer and a second layer upon the semiconductor device of the semiconductor substrate having a semiconductor device according to the present invention, it is possible to form a pattern with a high degree of adhesiveness displaying, for instance, attribute information of the semiconductor device.

BRIEF DESCRIPTION OF THE DRAWINGS

Referring now to the attached drawings which form a part of this original disclosure:

FIGS. 6A to 6C are illustrations of the configuration of a transporting part.

FIG. 10 is a procedural chart illustrating pattern forming steps (a) through (e).

DETAILED DESCRIPTION OF EXEMPLARY EMBODIMENTS

An embodiment of a printing device according to the present invention will be described below with reference to FIGS. 1 through 9.

The embodiment described below merely illustrates one aspect of the present invention; the present invention is not limited thereto, and various modifications within the technical scope of the invention may be made as desired. In the below drawings, the scale and measurements of the various structures are different from those used in actuality in order to aid understanding of the various configurations thereof.

Semiconductor Substrate

Figure 1A:
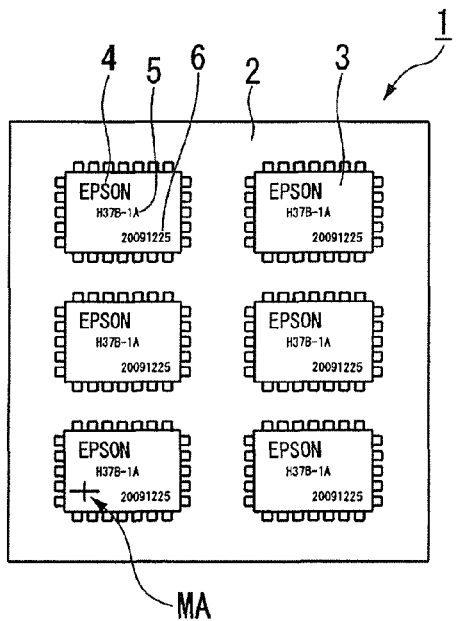
FIG. 1A is a schematic overhead view of a semiconductor substrate.

First, a semiconductor substrate will be described as an example of a target of drawing/printing using a printing device. FIG. 1A is a schematic overhead view of a semiconductor substrate. As illustrated in FIG. 1A, the semiconductor substrate 1 forming the substrate has a substrate 2 and a semiconductor device 3. The substrate 2 need only be heat resistant and capable of allowing the semiconductor device 3 to be mounted thereupon, and a glass epoxy substrate, paper phenolic substrate, paper epoxy substrate, or the like can be used as the substrate 2. The semiconductor device 3, which acts as a recording medium, can be a package substrate material or a semiconductor substrate material.

A semiconductor device 3 is mounted upon the substrate 2. Markings such as a company logo 4, model code 5, manufacturing number 6, and the like are present upon the semiconductor device 3 as printed or otherwise delineated patterns. These markings are printed by a printing device described below.

Printing Device

Figure 1B:
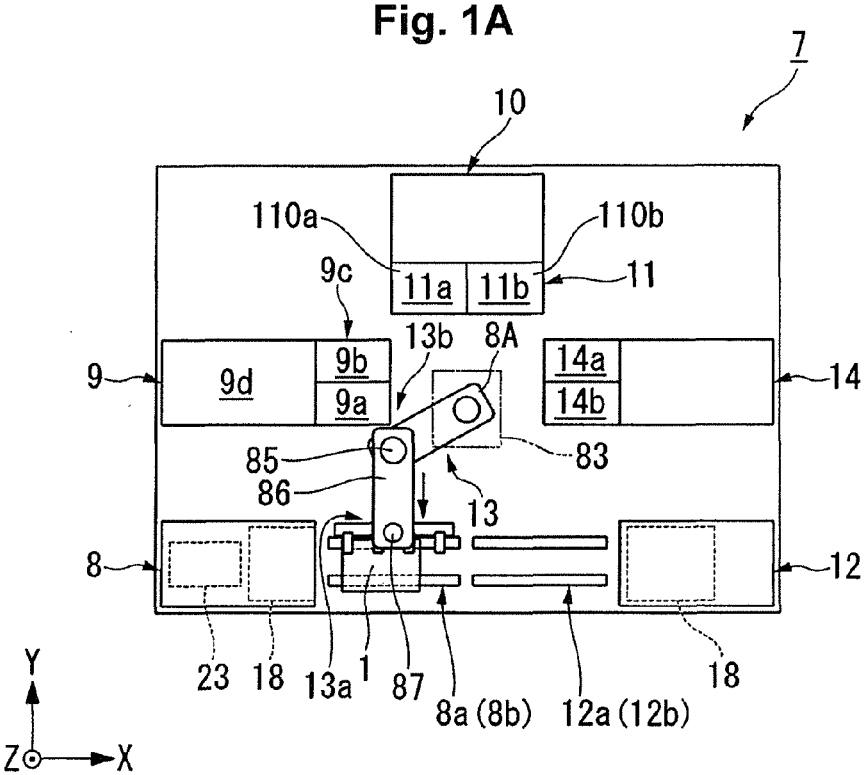
FIG. 1B is a schematic overhead view of a droplet ejecting apparatus.

FIG. 1B is a schematic overhead view of a printing device.

Figure 8:
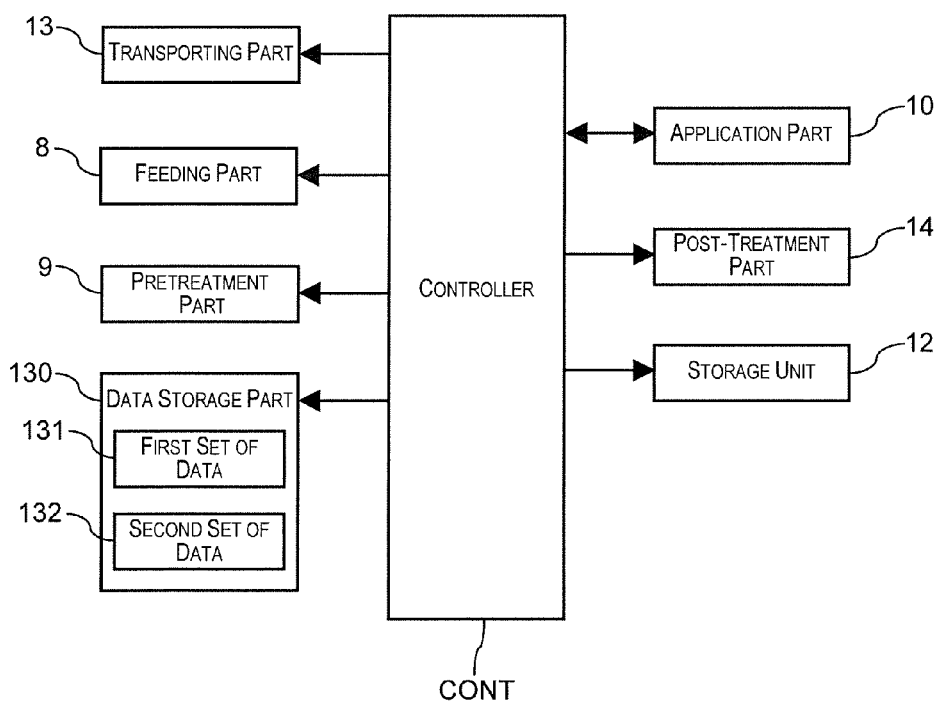
FIG. 8 is a block diagram of a control system.

As shown in FIG. 1B, the printing device 7 is primarily constituted of a plurality of processing devices that perform printing-related processes, including a feeding part 8, a pre-processing part 9, an application part (printing part) 10, a cooling part 11, a storage unit 12, a transporting part 13, a post-treatment part 14, and a controller CONT (see FIG. 8).

In the following description, the direction in which the feeding part 8 and storage unit 12 are aligned and the direction in which the pre-processing part 9, cooling part 11, and post-treatment part 14 are aligned will be referred to as the "X direction". The direction perpendicular to the X direction will be referred to as the "Y direction"; and the application part 10, cooling part 11, and transporting part 13 are aligned in the Y direction. The vertical direction will be referred to as the "Z direction".

The feeding part 8 has a container containing a plurality of semiconductor substrates 1. The feeding part 8 has a relay position 8a, and the semiconductor substrates 1 are supplied from the container to the relay position 8a. The relay position 8a is provided with a pair of rails 8b extending in the X direction disposed at roughly the same height as the semiconductor substrates 1 dispensed from the container.

The pre-processing part 9 has a function of heating and modifying the surface of the semiconductor device 3. The pre-processing part 9 regulates the spreading of the droplets ejected onto the semiconductor device 3 and the adhesiveness of the printed markings. The pre-processing part 9 has a first relay position 9a and a second relay position 9b, and takes in an unprocessed semiconductor substrate 1 from the first relay position 9a or the second relay position 9b, and modifies the surface thereof. Afterwards, the pre-processing part 9 transfers the processed semiconductor substrate 1 to the first relay position 9a or the second relay position 9b, and rests the semiconductor substrate 1 there. The first relay position 9a and second relay position 9b together form a relay position 9c. Processing position 9d is the position within the pre-processing part 9 wherein the pre-processing is performed.

The cooling part 11 is disposed at the relay position of the application part 10, and has the function of cooling the semiconductor substrate 1 after the same has been heated and surface modified by the pre-processing part 9. The cooling part 11 has processing positions 11a and 11b that each retain and cool the semiconductor substrate 1. The processing positions 11a and 11b are referred to collectively as processing position 11c.

The application part 10 has the function of ejecting droplets onto the semiconductor device 3 so as to mark out (print) a marking, and solidifying or curing the delineated marking. The application part 10 transfers the unprinted semiconductor substrate 1 from the relay position constituted by the cooling part 11 and performs marking and curing. Afterwards, the application part 10 transfers the printed semiconductor substrate 1 to the cooling part 11 and rests the semiconductor substrate 1 there.

The post-treatment part 14 performs post-processing by reheating the semiconductor substrate 1 positioned on the cooling part 11 after marking has been performed by the application part 10. The post-treatment part 14 has a first relay position 14a and a second relay position 14b. The first relay position 14a and second relay position 14b together form a relay position 14c.

The storage unit 12 has a container capable of containing a plurality of semiconductor substrates 1. The storage unit 12 has a relay position 12a, and a semiconductor substrate 1 is transferred from the relay position 12a into the container. The relay position 12a is provided with a pair of rails 12b extending in the X direction disposed at roughly the same height as the container containing the semiconductor substrates 1. An operator transports the container containing the semiconductor substrates 1 out of the printing device 7.

A transporting part 13 is disposed in a central position of the printing device 7. The transporting part 13 has a scalar robot equipped with an arm 13b. A gripper 13a that grips the semiconductor substrate 1 in a cantilevered manner and supports it from its reverse side (undersurface) is provided on a tip of the arm 13b. The relay positions 8a, 9c, 11, 14c, and 12a are positioned within the range of movement of the gripper 13a. Thus, the gripper 13a is capable of transporting a semiconductor substrate 1 between the relay positions 8a, 9c, 11, 14c, and 12a. The controller CONT is a device for controlling the overall operation of the printing device 7, and supervises the operating status of each part of the printing device 7. The controller also issues a command signal to the transporting part 13 to transport the semiconductor substrate 1. In this way, the semiconductor substrate 1 passes through each part in turn and is printed.

Feeding Part

Figure 2A:
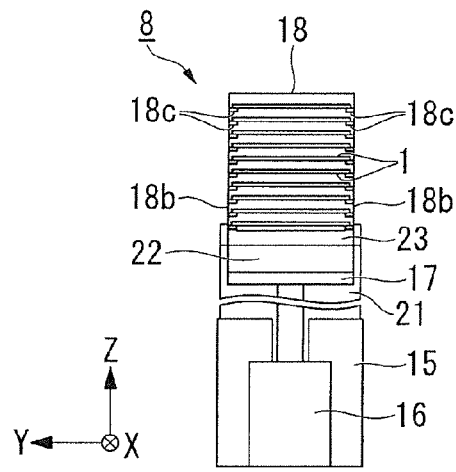
FIGS. 2A to 2C are schematic illustrations of a feeding part.
Figure 2B:
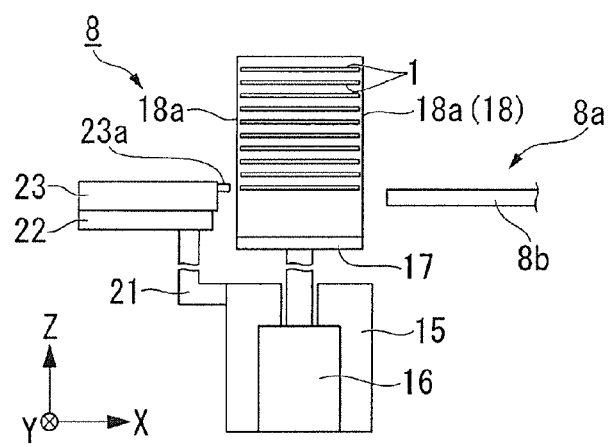
Figure 2C:
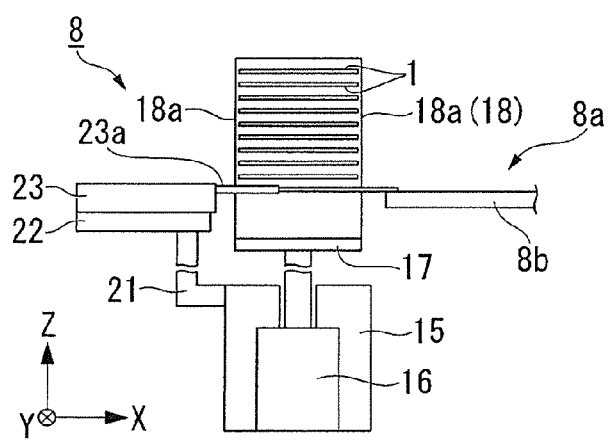

FIG. 2A is a schematic front view of a feeding part, and FIGS. 2B and 2C are schematic side views of a feeding part. As shown in FIGS. 2A and 2B, the feeding part 8 has a base 15. A lift device 16 is provided within the base 15. The lift device 16 has a direct actuation mechanism that operates in the Z direction. Mechanisms such as a ball screw/rotary motor combination, a hydraulic cylinder/oil pump combination, or the like may be used as the direct actuation mechanism. In this embodiment, a mechanism formed from, for example, a ball screw and a stepper motor is employed. A lift platform 17 connected to the lift device 16 is provided on an upper side of the base 15. The lift platform 17 is configured so as to be able to ascend and descend only a predetermined distance using the lift device 16.

A cuboidal container 18 is provided above the lift platform 17, inside of which are contained a plurality of semiconductor substrates 1. An opening 18a is formed on both surfaces of the container 18 in the X direction, through which the semiconductor substrates 1 may enter and exit. Convex rails 18c are formed on the interiors of two side surfaces 18b on both sides of the container 18 in the Y direction, and the rails 18c extend in the X direction. The rails 18c are arrayed in a plurality of equidistant intervals in the Z direction. The semiconductor substrates 1 are inserted along the rails 18c in the X direction or the negative X direction and are stored arranged in the Z direction.

An ejector 23 is provided on a side of the base 15 in the X direction with a supporting member 21 and support platform 22 disposed therebetween. An ejector pin 23a, provided on the ejector 23 is thrust outwards in the X direction by a direct actuation mechanism similar to that of the lift device 16 so as to push a semiconductor substrate 1 out towards the rails 8b. As such, the ejector pin 23a is disposed at roughly the same height as the rails 8b.

As illustrated in FIG. 2C, the ejector pin 23a of the ejector 23 is projected in the positive X direction so that a semiconductor substrate 1 positioned slightly higher along the positive Z direction than the rails 18c is ejected from the container 18, moving onto and supported by the rails 8b.

After the semiconductor substrate 1 has moved onto the rails 8b, the ejector pin 23a returns to a standby position as shown in FIG. 2B. Next, the lift device 16 lowers the container 18 so that the next semiconductor substrate 1 to be processed arrives at a height level with the ejector pin 23a. After this, the ejector pin 23a is projected outwards as described above so as to move the semiconductor substrate 1 onto the rails 8b.

In this way, the feeding part 8 moves the semiconductor substrates 1 in order from the container 18 onto the rails 8b. After all the semiconductor substrates 1 within the container 18 have been moved onto relay positions 9a and 9b, an operator replaces the empty container 18 with another container 18 containing semiconductor substrates 1. In this way, semiconductor substrates 1 can be fed into the feeding part 8.

Pre-Processing Part

The pre-processing part 9 performs pre-processing at processing position 9d upon the semiconductor substrates 1 conveyed to the relay positions 9a and 9b. Examples of such pre-processing include irradiation of the heated substrate with active light generated by a low-pressure mercury vapor lamp, hydrogen burner, excimer laser, plasma discharger, or the like. Using a mercury vapor lamp enables the hydrophobicity of the surface of the semiconductor substrate 1 to be modified by irradiating the semiconductor substrate 1 with ultraviolet light. Using a hydrogen burner enables the surface to be roughened by partially reducing the oxidized surface of the semiconductor substrate 1. Using an excimer laser enables the surface to be roughened by partially melting and solidifying the surface of the semiconductor substrate 1. Using a plasma or corona discharger enables surface roughening by mechanically abrading the surface of the semiconductor substrate 1. In this embodiment, a mercury vapor lamp is employed. After pre-processing is complete, the pre-processing part 9 transfers the semiconductor substrate 1 to the relay position 9c. Next, the transporting part 13 removes the semiconductor substrate 1 from the relay position 9c.

Cooling Part

The cooling part 11 is provided with processing positions 11a and 11b, and has cooling platforms 110a and 110b that are heat sinks or the like, the upper surfaces of which hold the semiconductor device 3 in place using suction. The processing positions 11a and 11b (cooling platforms 110a and 110b) are positioned within the range of motion of the gripper 13a, and the cooling platforms 110a and 110b are exposed at the processing positions 11a and 11b. Thus, the transporting part 13 is capable of easily placing the semiconductor substrates 1 on the cooling platforms 110a and 110b. After the semiconductor substrate 1 has been cooled, the semiconductor substrate 1 is left resting on cooling platform 110a at processing position 11a or on cooling platform 110b at processing position 11b. Thus, the gripper 13a of the transporting part 13 is capable of easily gripping and transporting the semiconductor substrate 1.

Application Part

Next, the application part 10, which ejects droplets onto a semiconductor substrate 1 to form markings, will be described with reference to FIGS. 3 through 6. A variety of devices for ejecting droplets are available, but a device using an inkjet method is preferred. An inkjet method allows microscopic droplets to be formed, making it well suited to fine processing.

Figure 3A:
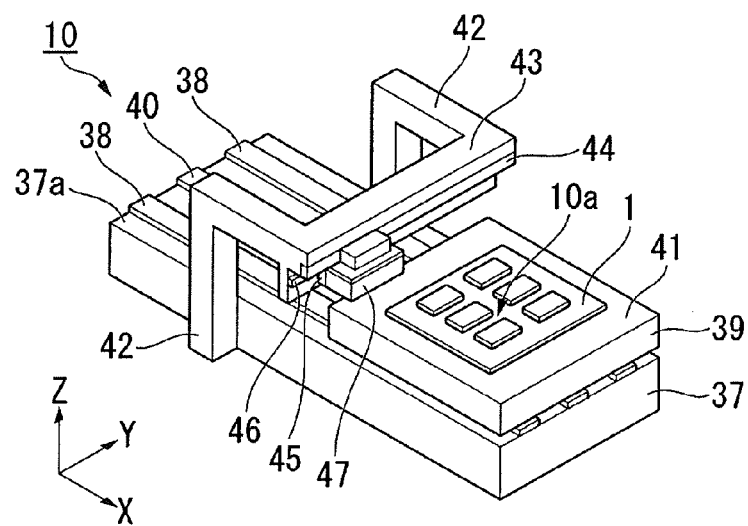
FIG. 3A is an outline perspective view of the configuration of an application part.

FIG. 3A is an outline perspective view of the configuration of an application part. Droplets are ejected onto the semiconductor substrate 1 by the application part 10. As illustrated in FIG. 3A, the application part 10 has a cuboidal base 37. The direction in which the droplet ejection head and the ejected material moves relative to each other when droplets are ejected is the primary scanning direction. The direction perpendicular to the primary scanning direction is the secondary scanning direction.

The secondary scanning direction is the direction in which the droplet ejection head and the ejected material move relative to each other when shifting lines. In this embodiment, the Y direction (second direction) is the primary scanning direction, and the X direction (first direction) is the secondary scanning direction.

A pair of guide rails 38 extending in the X direction is provided along the entire length of the X direction on an upper surface 37a of the base 37. A stage 39 having a direct actuation mechanism not shown in the drawings is attached to an upper side of the base 37 corresponding to the pair of guide rails 38. A linear motor, screw-type direct actuation mechanism, or the like may be used as the direct actuation mechanism of the stage 39. In this embodiment, for example, a linear motor is employed. The stage 39 is configured to travel and return at a predetermined speed along the X direction. The repetition of traveling and returning is referred to as scanning. A secondary scanning position detector 40 is further disposed on the upper surface 37a of the base 37 in parallel with the guide rails 38; this secondary scanning position detector 40 detects the position of the stage 39.

A rest surface (rest) 41 is formed on an upper surface of the stage 39, and the rest surface 41 is provided with a vacuum-type substrate chuck mechanism not shown in the drawings. After a semiconductor substrate 1 is placed upon the rest surface 41, the semiconductor substrate 1 is held in place on the rest surface 41 by the substrate chuck mechanism.

The position of the rest surface 41 when the stage 39 is positioned in, for example, the positive X direction is a relay position for a semiconductor substrate 1 loading or unloading position. The rest surface 41 is disposed so as to be exposed within the range of motion of the gripper 13a. Thus, the transporting part 13 is capable of easily placing a semiconductor substrate 1 on the rest surface 41. After the semiconductor substrate 1 has been coated (markings have been applied), the semiconductor substrate 1 rests upon the rest surface 41, which is a relay position. Thus, the gripper 13a of the transporting part 13 is capable of easily gripping and transporting a semiconductor substrate 1.

A pair of support platforms 42 is provided on both sides of the base 37 in the Y direction, and a guide member 43 extending in the Y direction is provided so as to bridge the pair of support platforms 42. A guide rail 44 extending in the Y direction is provided along the entirety of the X direction on the underside of the guide member 43. A roughly cuboidal carriage (transport means) 45 capable of moving along the guide rail 44 is formed. The carriage 45 has a direct actuation mechanism, and the direct actuation mechanism may be one similar to that of, for example, the stage 39. The carriage 45 scans along the Y direction. A primary scanning position detector 46 that measures the position of the carriage 45 is provided between the guide member 43 and the carriage 45. A head unit 47 is provided on the lower edge of the carriage 45, and a droplet ejection head not shown in the drawings is provided on the side of the head unit 47 towards the stage 39.

Figure 3B:
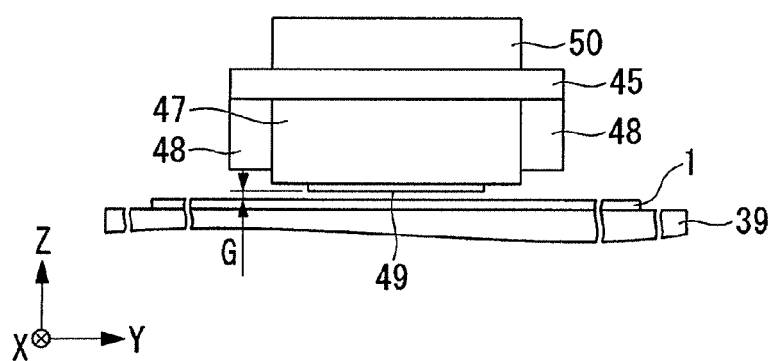
FIG. 3B is a schematic side view of a carriage.

FIG. 3B is a schematic side view of a carriage. As shown in FIG. 3B, the head unit 47 and a pair of curing units 48 acting as irradiators are disposed on the side of the carriage 45 nearer the semiconductor substrate 1 at equal respective distances from the center of the carriage 45 with respect to the Y direction. A droplet ejection head (ejection head) 49 that ejects droplets is provided on the side of the head unit 47 nearer to the semiconductor substrate 1.

A container tank 50 is disposed on the upper side of the carriage 45 as viewed in the drawing; this container tank 50 contains a functional fluid. The droplet ejection head 49 and container tank 50 are connected by a tube not shown in the drawings, through which the functional fluid within the container tank 50 is supplied to the droplet ejection head 49.

The primary components of the functional fluid are a resin, a photopolymerization initiator as a curative, and a vehicle or dispersing medium. A color agent such as a pigment or dye, a functional component such as a hydrophilic or hydrophobic resurfacing agent, or the like may be added to the primary components to obtain a functional fluid with unique functionality. In this embodiment, for example, a white pigment is added. The resin component of the functional fluid is for forming a resin layer. There is no particular limitation upon the resin component as long as it is liquid at room temperature and can be polymerized. Also, a resin component with low viscosity is preferable, as is one that is an oligomer. A monomer is especially preferable. The photopolymerization initiator acts upon a cross-linkable group of the polymer to effect a crosslinking reaction; an example of one such photopolymerization initiator is benzyl dimethyl ketal or the like. The vehicle or dispersion medium regulates the viscosity of the resin component. By adjusting the functional fluid to a viscosity such that it is easily ejected from the droplet ejection head, it is possible for the droplet ejection head to stably eject functional fluid.

The specific composition of the functional fluid will be described below.

An example of the functional fluid of this embodiment is a radiation-curable inkjet ink composition. The ink composition contains a polymerizing compound containing at least one compound having a pentaerythritol skeleton, a photopolymerization initiator, and a predetermined amount of polysiloxane having an HLB value falling within a predetermined range. In this disclosure, "HLB" (hydrophilic-lipophilic balance) is a quantification of the hydrophilic-lipophilic balance of the polysiloxane. HLB value is as calculated according to the Griffin method.

The above ink composition has the characteristic of being suited for use in recording upon a recording medium such as a package substrate material or a semiconductor substrate material. The additives (components) included in or capable of being included in the ink composition of this embodiment will be described below.

Polymerizing Compound

The polymerizing compound included in the ink composition of this embodiment is capable of being polymerized through the action of the photopolymerization initiator described below upon photo-irradiation, curing the printed ink.

Compound having Pentaerythritol Skeleton

The ink composition of this embodiment contains one or more types of compound having a pentaerythritol skeleton (C(CH2O-)4) as a polymerizing compound.

Including a compound having a pentaerythritol skeleton in the ink composition especially improves friction resistance in the cured ink.

Examples of a compound having a pentaerythritol skeleton include at least one of (meth)acrylate compounds such as pentaerythritol tri(meth)acrylate, pentaerythritol tetra(meth)acrylate, pentaerythritol ethoxy-tetra(meth)acrylate, dipentaerythritol penta(meth)acrylate, dipentaerythritol hexa(meth)acrylate, and polypentaerythritol poly(meth)acrylate; oxetane compounds such as pentaerythritol tris(3-ethyl-3-oxetanyl methyl)ether and pentaerythritol tetrakis(3-ethyl-3-oxetanyl methyl)ether; and ethylene oxide (EO) adducts and propylene oxide (PO) adducts thereof.

Of these, a multifunctional (meth)acrylate having a pentaerythritol skeleton is preferable, and a multifunctional acrylate having a pentaerythritol skeleton is more preferable. Among multifunctional (meth)acrylates having a pentaerythritol skeleton, at least one of pentaerythritol tri(meth)acrylate and pentaerythritol tetra(meth)acrylate is preferable; one of pentaerythritol triacrylate and pentaerythritol tetraacrylate is more preferable; and pentaerythritol triacrylate is still more preferable. A compound such as those described above decreases ink viscosity and increases ink cross-linkability.

The above compound having a pentaerythritol skeleton preferably constitutes from 7 to 25% of the total mass of the ink composition (100%), more preferably from 10 to 20% by mass. Including an amount of compound having a pentaerythritol skeleton falling within the above range yields superior visibility of the recorded image, ink ejection stability, and friction resistance in the cured ink.

Compound having Both Vinyl Group and (Meth)Acrylate Group in Molecule Thereof

The ink composition of this embodiment may contain a compound ("monomer A") expressed by formula (I) below.

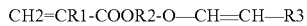 (I)

(where R1 is a hydrogen atom or a methyl group, R2 is a bivalent organic residue containing from 2 to 20 carbon atoms, and R3 is a hydrogen atom or a monovalent organic residue having from 1 to 11 carbon atoms)

The above monomer A is a compound having both a vinyl group and a (meth)acrylate group in the molecule thereof, and can also be referred to as a (meth)acrylate ester containing a vinyl ether group.

Including a monomer A in the ink composition yields improved ink curability.

For the bivalent organic residue expressed by R2 in formula (I) above, a straight-chain, branched, or cyclic alkylene group having from 2 to 20 carbon atoms; an alkylene group having from 2 to 20 carbon atoms that has an oxygen atom in its structure with at least one of either an ether bond or an ester bond; or a bivalent aromatic group having from 6 to 11 carbon atoms capable of substitution is preferable. Of these, an alkylene group having from 2 to 6 carbon atoms such as an ethylene group, n-propylene group, isopropylene group, or butylene group; or an alkylene group having from 2 to 9 carbon atoms and containing an oxygen atom in its structure through an ether bond, such as an oxyethylene group, oxy-n-propylene group, oxyisopropylene group, or oxybutylene group is preferable.

For the monovalent organic residue having from 1 to 11 carbon atoms expressed by R3 in formula (I) above, a straight-chain, branched, or cyclic alkyl group having from 1 to 10 carbon atoms; or a substitutable aromatic group having from 6 to 11 carbon atoms is preferable. Of these, an alkyl group that is a methyl group or an ethyl group containing 1 or 2 carbon atoms; or an aromatic group containing from 6 to 8 carbon atoms such as an alkyl group, phenyl group, or benzyl group is preferable.

If the organic residue is substitutable, the substituents can be divided into groups containing a carbon atom and groups not containing a carbon atom. If the substituent is a group containing a carbon atom, the carbon atom is counted towards the carbon atom number of the organic residue. Examples of groups including a carbon atom include, but are not limited to, a carboxyl group or an alkoxy group. Examples of groups not including a carbon atom include, but are not limited to, a hydroxyl group or a halo group.

Specific examples of the monomer A represented by formula (I) above include, but are not limited to, (meth)acrylic acid 2-vinyloxyethyl, (meth)acrylic acid 3-vinyloxypropyl, (meth)acrylic acid 1-methyl-2-vinyloxyethyl, (meth)acrylic acid 2-vinyloxypropyl, (meth)acrylic acid 4-vinyloxybutyl, (meth)acrylic acid 1-methyl-3-vinyloxypropyl, (meth)acrylic acid 1-vinyloxymethylpropyl, (meth)acrylic acid 2-methyl-3-vinyloxypropyl, (meth)acrylic acid 1,1-dimethyl-2-vinyloxyethyl, (meth)acrylic acid 3-vinyloxybutyl, (meth)acrylic acid 1-methyl-2-vinyloxypropyl, (meth)acrylic acid 2-vinyloxybutyl, (meth)acrylic acid 4-vinyloxycyclohexyl, (meth)acrylic acid 5-vinyloxypentyl, (meth)acrylic acid 6-vinyloxyhexyl, (meth)acrylic acid 4-vinyloxymethylcyclohexylmethyl, (meth)acrylic acid 3-vinyloxymethylcyclohexylmethyl, (meth)acrylic acid 2-vinyloxymethylcyclohexylmethyl, (meth)acrylic acid p-vinyloxymethylphenylmethyl, (meth)acrylic acid m-vinyloxymethylphenylmethyl, (meth)acrylic acid o-vinyloxymethylphenylmethyl, (meth)acrylic acid 2-(vinyloxyethoxy)ethyl, (meth)acrylic acid 2-(vinyloxyisopropoxy)ethyl, (meth)acrylic acid 2-(vinyloxyethoxy)propyl, (meth)acrylic acid 2-(vinyloxyethoxy)isopropyl, (meth)acrylic acid 2-(vinyloxyisopropoxy)propyl, (meth)acrylic acid 2-(vinyloxyisopropoxy)isopropyl, (meth)acrylic acid 2-(vinyloxyethoxyethoxy)ethyl, (meth)acrylic acid 2-(vinyloxyethoxyisopropoxy)ethyl, (meth)acrylic acid 2-(vinyloxyisopropoxyethoxy)ethyl, (meth)acrylic acid 2-(vinyloxyisopropoxyisopropoxy)ethyl, (meth)acrylic acid 2-(vinyloxyethoxyethoxy)propyl, (meth)acrylic acid 2-(vinyloxyethoxyisopropoxy)propyl, (meth)acrylic acid 2-(vinyloxyisopropoxyethoxy)propyl, (meth)acrylic acid 2-(vinyloxyisopropoxyisopropoxy)propyl, (meth)acrylic acid 2-(vinyloxyethoxyethoxy)isopropyl, (meth)acrylic acid 2-(vinyloxyethoxyisopropoxy)isopropyl, (meth)acrylic acid 2-(vinyloxyisopropoxyethoxy)isopropyl, (meth)acrylic acid 2-(vinyloxyisopropoxyisopropoxy)isopropyl, (meth)acrylic acid 2-(vinyloxyethoxyethoxyethoxy)ethyl, (meth)acrylic acid 2-(vinyloxyethoxyethoxyethoxyethoxy)ethyl, (meth)acrylic acid 2-(isopropenoxyethoxy)ethyl, (meth)acrylic acid 2-(isopropenoxyethoxyethoxy)ethyl, (meth)acrylic acid 2-(isopropenoxyethoxyethoxy)ethyl, (meth)acrylic acid 2-(isopropenoxyethoxyethoxyethoxy)ethyl, (meth)acrylic acid polyethylene glycol monovinyl ether, and (meth)acrylic acid polypropylene glycol monovinyl ether.

Of these, (meth)acrylic acid 2-vinyloxyethyl, (meth)acrylic acid 3-vinyloxypropyl, (meth)acrylic acid 1-methyl-2-vinyloxyethyl, (meth)acrylic acid 2-vinyloxypropyl, (meth)acrylic acid 4-vinyloxybutyl, (meth)acrylic acid 4-vinyloxycyclohexyl, (meth)acrylic acid 5-vinyloxypentyl, (meth)acrylic acid 6-vinyloxyhexyl, (meth)acrylic acid 4-vinyloxymethylcyclohexylmethyl, (meth)acrylic acid p-vinyloxymethylphenylmethyl, (meth)acrylic acid 2-(vinyloxyethoxy)ethyl, (meth)acrylic acid 2-(vinyloxyethoxyethoxy)ethyl, and (meth)acrylic acid 2-(vinyloxyethoxyethoxyethoxy)ethyl are preferable.

Of these, (meth)acrylic acid 2-(vinyloxyethoxy)ethyl is preferable because of its low viscosity, high flash point, and superior curability, and 2-(vinyloxyethoxy)ethyl acrylate is more preferable because of its lack of odor and irritation to the skin, and superior reactivity and adhesiveness.

Examples of (meth)acrylic acid 2-(vinyloxyethoxy)ethyl include (meth)acrylic acid 2-(2-vinyloxyethoxy)ethyl and (meth)acrylic acid 2-(1-vinyloxyethoxy)ethyl, and examples of 2-(vinyloxyethoxy)ethyl acrylate include 2-(2-vinyloxyethoxy)ethyl acrylate and 2-(1-vinyloxyethoxy)ethyl acrylate.

One type of monomer A may be used, or a combination of two or more types may be used.

The monomer A preferably constitutes from 20 to 50% by mass of the total mass (100%) of the ink composition. An amount of monomer A within the range given above enables favorable friction resistance to be obtained in the cured ink.

Methods of producing the monomer A represented by formula (I) above include, but are not limited to, esterifying (meth)acrylic acid and a vinyl ether containing a hydroxyl group (method B), esterifying a (meth)acrylate halide and a vinyl ether containing a hydroxyl group (method C), esterifying a (meth)acrylic anhydride and a vinyl ether containing a hydroxyl group (method D), transesterifying a (meth)acrylate ester and a vinyl ether containing a hydroxyl group (method E), esterifying (meth)acrylic acid and a vinyl ether containing a halogen (method F), esterifying a (meth)acrylic acid alkali (earth) metal salt and a vinyl ether containing a halogen (method G), vinyl substituting a (meth)acrylate ester containing a hydroxyl group and vinyl carboxylate (method H) and transesterifying a (meth)acrylate ester containing a hydroxyl group and an alkyl vinyl ether (method I).

Of these, method E is especially preferable, as it allows the desired effects of this embodiment to be more greatly demonstrated.

Other Polymerizing Compounds

Examples of polymerizing compounds other than those described above ("other polymerizing compounds") include various publicly known monomers and oligomers that are monofunctional, bifunctional, trifunctional, or more. Examples of such monomers include unsaturated carboxylic acids such as (meth)acrylic acid, itaconic acid, crotonic acid, isocrotonic acid, and maleic acid or salts or esters thereof; urethane; amides and anhydrides thereof; acrylonitrile; styrene; and various unsaturated polyesters, unsaturated polyethers, unsaturated polyamides, and unsaturated urethanes. Examples of oligomers include oligomers formed from the above monomers, such as a straight-chained acryl oligomer; epoxy(meth)acrylate; oxetane(meth)acrylate; aliphatic urethane(meth)acrylate; aromatic urethane(meth)acrylate; and polyester(meth)acrylate.

An n-vinyl compound may also be included as another mono- or multifunctional monomer. Examples of such n-vinyl compounds include n-vinylcaprolactam, n-vinylformamide, n-vinylacetamide, n-vinylpyrrolidone, and acrylylmorpholine, as well as derivatives thereof.

Of these, n-vinylcaprolactam is preferable as it enables favorable friction resistance in the cured ink.

Of these other polymerizing compounds, (meth)acrylic acid esters, i.e., (meth)acrylates, are preferable; a multifunctional (meth)acrylate that is at least bifunctional is more preferable; and a multifunctional acrylate is still more preferable.

Of the above (meth)acrylates, examples of monofunctional (meth)acrylates include isoamyl(meth)acrylate, stearyl (meth)acrylate, lauryl(meth)acrylate, octyl(meth)acrylate, decyl(meth)acrylate, isomyristyl(meth)acrylate, isostearyl (meth)acrylate, 2-ethylhexyl-diglycol(meth)acrylate, 2-hydroxybutyl(meth)acrylate, butoxyethyl(meth)acrylate, ethoxydiethylene glycol(meth)acrylate, methoxydiethylene glycol(meth)acrylate, methoxypolyethylene glycol(meth) acrylate, methoxypropylene glycol(meth)acrylate, phenoxyethyl(meth)acrylate, tetrahydrofurfuryl(meth)acrylate, isobornyl(meth)acrylate, 2-hydroxyethyl(meth)acrylate, 2-hydroxypropyl(meth)acrylate, 2-hydroxy-3-phenoxypropyl(meth)acrylate, a lactone-modified flexible (meth)acrylate, t-butylcyclohexyl(meth)acrylate, dicyclopentanyl (meth)acrylate, and dicycloepentenyl oxyethyl(meth) acrylate.

Of these, because they reduce viscosity and odor, at least one of phenoxyethyl(meth)acrylate and isobornyl(meth) acrylate is preferable, phenoxyethyl(meth)acrylate is more preferable, and phenoxyethyl acrylate is even more preferable.

Of the above (meth)acrylates, examples of multifunctional (meth)acrylates include at least one of bifunctional(meth) acrylates such as triethylene glycol di(meth)acrylate, tetraethylene glycol di(meth)acrylate, polyethylene glycol di(meth)acrylate, tripropylene glycol di(meth)acrylate, polypropylene glycol di(meth)acrylate, 1,4-butanediol di(meth)acrylate, 1,6-hexanediol di(meth)acrylate, 1,9-nonanediol di(meth)acrylate, neopentyl glycol di(meth)acrylate, dimethylol-tricyclodecane di(meth)acrylate, bisphenol A di(meth)acrylate, hydroxypivalate neopentyl glycol di(meth)acrylate, and polytetramethylene glycol di(meth) acrylate; and trifunctional or greater (meth)acrylates such as trimethylol propane tri(meth)acrylate, glycerin propoxy tri (meth)acrylate, caprolactone-modified trimethylolpropane tri(meth)acrylate, ditrimethylolpropane tetra(meth)acrylate, sorbitol penta(meth)acrylate, and (meth)acrylates having a dipentaerythritol skeleton such as dipentaerythritol hexa(meth)acrylate, caprolactam-modified dipentaerythritol hexa (meth)acrylate, dipentaerythritol penta(meth)acrylate, and caprolactone-modified dipentaerythritol hexa(meth)acrylate; (meth)acrylates having a tripentaerythritol skeleton such as propionic acid-modified tripentaerythritolpenta(meth)acrylate, tripentaerythritolhexa(meth)acrylate, tripentaerythritol hepta(meth)acrylate, and tripentaerythritol octa(meth)acrylate; (meth)acrylates having a tetrapentaerythritol skeleton such as tetrapentaerythritol penta(meth)acrylate, tetrapentaerythritol hexa(meth)acrylate, tetrapentaerythritol hepta (meth)acrylate, tetrapentaerythritol octa(meth)acrylate, tetrapentaerythritol nona(meth)acrylate, and tetrapentaerythritol deca(meth)acrylate; (meth)acrylates having a pentapentaerythritol skeleton such as pentapentaerythritol undeca(meth)acrylate and pentapentaerythritol dodeca(meth)acrylate; and ethylene oxide (EO) adducts and propylene oxide (PO) adducts thereof.

Of these, because they improve the friction resistance of the cured ink, one or more selected from the group consisting of (meth)acrylates having a dipentaerythritol skeleton, (meth) acrylates having a tripentaerythritol skeleton, (meth)acrylates having a tetrapentaerythritol skeleton, (meth)acrylates having a pentapentaerythritol skeleton, and polypentaerythritol poly(meth)acrylate is preferable.

One type of the above other polymerizing compounds may be used singly, or a combination of two types or more may be used.

Leveling Agent

The ink composition of this embodiment contains polysiloxane as a leveling agent, which is a type of surfactant, as an essential ingredient. Including polysiloxane in the above ink composition enables improved visibility of the recorded image, ink ejection stability, and friction resistance in the cured ink.

The HLB value of the polysiloxane is from 5 to 12. An HLB value of from 5 to 12 yields superior visibility of the recorded image, ink ejection stability, and friction resistance in the cured ink, with visibility and ejection stability being especially superior. In order to further improve visibility and ejection stability, the HLB value is preferably between 9 and 12.

The polysiloxane constitutes from 0.1 to 2% by mass, preferably from 0.12 to 1.6% by mass, of the total mass (100%) of the ink composition. Including an amount of polysiloxane falling within the above range yields superior visibility of the recorded image, ink ejection stability, and friction resistance in the cured ink.

Photopolymerization Initiator

The ink composition of this embodiment contains a photopolymerization initiator. The photopolymerization initiator is used to cure the ink present on the surface of the recording medium to form an image by photopolymerization through irradiation. Examples of suitable types of radiation include gamma waves, beta waves, electron beams, ultraviolet (UV) light, visible light, and infra-red light. Of these, ultraviolet light is preferable as it demonstrates superior stability and enables light source costs to be reduced. While there is no limitation upon the photopolymerization initiator as long as it uses light energy to form active species such as radicals and cations to initiate polymerization of the above polymerizing compound, a radical photopolymerization initiator or cationic photopolymerization initiator can be used; of these, a radical photopolymerization initiator is preferably used.

Examples of the above radical photopolymerization initiator include aromatic ketones, acyl phosphine oxide compounds, aromatic onium salt compounds, organic peroxides, thio compounds (thioxantone compounds, thiophenyl groups, and the like), hexa-aryl bi-imidazole compounds, acetoxime ester compounds, borate compounds, azinium compounds, metallocene compounds, active ester compounds, compounds having a carbon-halogen bond, and alkylamine compounds.

Of these, because they especially improve ink curability, at least one of an acyl phosphine oxide compound and a thioxantone compound is preferable, and an acyl phosphine oxide compounds is more preferable.

Specific examples of radical photopolymerization initiators include acetophenone, acetophenone benzyl ketal, 1-hydroxycyclohexylphenyl ketone, 2,2-dimethoxy-2-phenyl acetophenone, xanthone, fluorenone, benzaldehyde, fluorene, anthoraquinone, triphenylamine, carbazole, 3-methyl acetophenone, 4-chlorobenzophenone, 4,4'-dimethoxybenzophenone, 4,4'-diaminobenzophenone, Michler's ketone, benzoin propyl ether, benzoin ethyl ether, benzyl dimethyl ketal, 1-(4-isopropyl phenyl)-2-hydroxy-2-methyl propane-1-on, 2-hydroxy-2-methyl-1-phenylpropane-1-on, thioxantone, diethyl thioxantone, 2-isopropylthioxantone, 2-chlorothioxantone, 2-methyl-1-[4-(methyl thio)phenyl]-2-morpholino-propane-1-on, bis(2,4,6-trimethyl benzoyl)-phenyl phosphine oxide, 2,4,6-trimethyl benzoyl-diphenyl-phosphine oxide, 2,4-diethyl thioxantone, and bis-(2,6-dimethoxy benzoyl)-2,4,4-trimethylpentyl phosphine oxide.

Examples of commercially available radical photopolymerization initiator include IRGACURE 651 (2,2-dimethoxy-1,2-diphenyl ethane-1-on), IRGACURE 184 (1-hydroxycyclohexyl-phenyl-ketone), DAROCUR 1173 (2-hydroxy-2-methyl-1-phenyl-propane-1-on), IRGACURE 2959 (1-[4-(2-hydroxyethoxy)-phenyl]-2-hydroxy-2-methyl-1-propane-1-on), IRGACURE 127 (2-hydroxy-1-{4-[4-(2-hydroxy-2-methyl-propnyl)-benzyl]phenyl}-2-methyl-propane-1-on, IRGACURE 907 (2-methyl-1-(4-methyl thiophenyl)-2-morpholinopropane-1-on), IRGACURE 369 (2-benzyl-2-dimethylamino-1-(4-morpholinophenyl)-butanone-1), IRGACURE 379 (2-(dimethylamino)-2-[(4-methylphenyl)methyl]-1-[4-(4-morpholinyl)phenyl]-1-butanone), DAROCUR TPO (2,4,6-trimethylbenzoyl-diphenyl-phosphine oxide), IRGACURE 819 (bis(2,4,6-trimethylbenzoyl)-phenyl phosphine oxide), IRGACURE 784 (bis(eta-5-2,4-cyclopentadiene-1-yl)-bis(2,6-difluoro-3-(1H-pyrrole-1-yl)-phenyl)titanium), IRGACURE OXE 01 (1.2-octanedione, 1-[4-(phenylthio)-, 2-(o-benzoyloxime)]), IRGACURE OXE 02 (ethanone, 1-[9-ethyl-6-(2-methylbenzoyl)-9H-carbazole-3-yl]-, 1-(o-acetyloxime)), and IRGACURE 754 (mixture of oxyphenyl acetic acid, 2-[2-oxo-2-phenylacetoxyethoxy]ethyl ester and oxyphenyl acetic acid, 2-(2-hydroxyethoxy)ethyl ester)(all produced by BASF); Speedcure TPO (produced by Lambson), KAYACURE DETX-S (2,4-diethylthioxantone) (produced by Nippon Kayaku Co., Ltd.); Lucirin TPO, LR8893, LR8970 (produced by BASF); Ubecryl P36 (produced by UCB), and the like.

One type of the above photopolymerization initiators may be used, or a combination of two or more types may be used.

In order to increase irradiation curing speed and prevent undissolved photopolymerization initiator or photopolymerization initiator-induced staining, the photopolymerization initiator preferably constitutes from 5 to 20% by mass of the total mass (100%) of the ink composition.

By using a photopolymerizing compound as the polymerizing compound described above, the addition of a photopolymerization initiator may be omitted. However, including a photopolymerization initiator is preferable as this allows polymerization initiation to be easily regulated.

Polymerization Inhibitor

The ink composition of this embodiment may include a polymerization inhibitor in order to prevent the polymerizing compound from polymerizing prior to curing. Examples of polymerization inhibitors include, but are not limited to, phenol compounds such as p-methoxyphenol, cresol, t-butylcatechole, di-t-butylpara-cresol, hydroquinone monomethyl ether, alpha-naphthol, 3,5-di-t-butyl-4-hydroxytoluene, 2,2'-methylene bis(4-methyl-6-t-butylphenol), 2,2'-methylenebis (4-ethyl-6-butylphenol), and 4,4'-thio bis(3-methyl-6-t-butylphenol); quinone compounds such as p-benzoquinone, anthraquinone, naphthoquinone, phenanthraquinone, p-xyloquinone, p-toluquinone, 2,6-dichloroquinone, 2,5-diphenyl-p-benzoquinone, 2,5-diacetoxy-p-benzoquinone, 2,5-dicaproxy-p-benzoquinone, 2,5-diacyloxy-p-benzoquinone, hydroquinone, 2,5-di-butyl hydroquinone, mono-t-butyl hydroquinone, monomethyl hydroquinone, and 2,5-di-t-amyl hydroquinone; amine compounds such as phenyl-beta-naphthylamine, p-benzyl aminophenol, di-beta-naphthyl paraphenylene diamine, dibenzyl hydroxylamine, phenyl hydroxylamine, and diethyl hydroxylamine; nitro compounds such as dinitrobenzene, trinitrotoluene, and picric acid; oxime compounds such as quinone dioxime and cyclohexanone oxime; and sulfur compounds such as phenothiazine.

Colorants

The ink composition of this embodiment preferably further contains a colorant. At least one of either a pigment or a dye can be used for the colorant.

Pigment

In this embodiment, the light fastness of the ink composition can be improved by using a pigment as a colorant. Either an inorganic pigment or an organic pigment can be used.

As an inorganic pigment, a carbon black (C.I. pigment Black 7) such as furnace black, lamp black, acetylene black, or channel black; iron oxide; or titanium oxide can be used.

As an organic pigment, an azo pigment such as an insoluble azo pigment, a condensed azo pigment, an azo lake pigment, or a chelate azo pigment; a phthalocyanine pigment; a perylene or perinone pigment; an anthraquinone pigment; a quinacridone pigment a dioxane pigment; a thioindigo pigment; an isoindolinone pigment; a quinophthalone pigment or other polycyclic pigment; a dye chelate (e.g., a basic dye chelate, an acidic dye chelate, or the like); a dye lake (basic dye lake, acidic dye lake; a nitro pigment; a nitroso pigment; aniline black; or a daylight fluorescent pigment can be used.

More specific examples of carbon blacks used as black inks include No. 2300, No. 900, MCF88, No. 33, No. 40, No. 45, No. 52, MA7, MA8, MA100, No. 2200B, and the like (produced by Mitsubishi Chemical Corporation); Raven 5750, Raven 5250, Raven 5000, Raven 3500, Raven 1255, Raven 700, and the like (produced by Carbon Columbia); Regal 400R, Regal 330R, Regal 660R, Mogul L, Monarch 700, Monarch 800, Monarch 880, Monarch 900, Monarch 1000, Monarch 1100, Monarch 1300, Monarch 1400, and the like (produced by CABOT JAPAN K.K.); and Color Black FW1, Color Black FW2, Color Black FW2V, Color Black FW18, Color Black FW200, Color Black S150, Color Black S160, Color Black S170, Printex 35, Printex U, Printex V, Printex 140U, Special Black 6, Special Black 5, Special Black 4A, and Special Black 4 (produced by Degussa).

Examples of pigments used as white inks include C.I. Pigment White 6, 18, and 21.

Examples of pigments used as yellow inks include C.I. Pigment Yellow 1, 2, 3, 4, 5, 6, 7, 10, 11, 12, 13, 14, 16, 17, 24, 34, 35, 37, 53, 55, 65, 73, 74, 75, 81, 83, 93, 94, 95, 97, 98, 99, 108, 109, 110, 113, 114, 117, 120, 124, 128, 129, 133, 138, 139, 147, 151, 153, 154, 167, 172, and 180.

Examples of pigments used as magenta inks include C.I. Pigment Red 1, 2, 3, 4, 5, 6, 7, 8, 9, 10, 11, 12, 14, 15, 16, 17, 18, 19, 21, 22, 23, 30, 31, 32, 37, 38, 40, 41, 42, 48 (Ca), 48 (Mn), 57 (Ca), 57:1, 88, 112, 114, 122, 123, 144, 146, 149, 150, 166, 168, 170, 171, 175, 176, 177, 178, 179, 184, 185, 187, 202, 209, 219, 224, and 245; or C.I. Pigment Violet 19, 23, 32, 33, 36, 38, 43, and 50.

Examples of pigments used as cyan inks include C.I. Pigment Blue 1, 2, 3, 15, 15:1, 15:2, 15:3, 15:34, 15:4, 16, 18, 22, 25, 60, 65, and 66; and C.I. Vat Blue 4 and 60.

Examples of pigments other than magenta, cyan, and yellow include C.I. Pigment Green 7 and 10; C.I. Pigment Brown 3, 5, 25, and 26; and C.I. Pigment Orange 1, 2, 5, 7, 13, 14, 15, 16, 24, 34, 36, 38, 40, 43, and 63.

One type of the above pigments may be used singly, or a combination of two types or more may be used.

If one of the above pigments is used, the average particle diameter thereof is preferably 300 nm or less, and more preferably from 50 to 250 nm. An average particle size within the range given above further improves reliability of ejection stability and dispersive stability of the ink composition, and allows an image of superior quality to be formed. For the purposes of this disclosure, the average particle diameter referred to here is as determined by dynamic light scattering.

Dyes

In this embodiment, a dye may be used as a colorant. There is no particular limitation upon the dye, and acidic dyes, direct dyes, reactive dyes, and basic dyes can be used. Examples of the above dyes include C.I. Acid Yellow 17, 23, 42, 44, 79, and 142; C.I. Acid Red 52, 80, 82, 249, 254, and 289; C.I. Acid Blue 9, 45, and 249; C.I. Acid Black 1, 2, 24, and 94; C.I. Food Black 1 and 2; C.I. Direct Yellow 1, 12, 24, 33, 50, 55, 58, 86, 132, 142, 144, and 173; C.I. Direct Red 1, 4, 9, 80, 81, 225, and 227; C.I. Direct Blue 1, 2, 15, 71, 86, 87, 98, 165, 199, and 202; C.I. Direct Black 19, 38, 51, 71, 154, 168, 171, and 195; C.I. Reactive Red 14, 32, 55, 79, and 249; and C.I. Reactive Black 3, 4, and 35.

One type of the above dyes may be used singly, or a combination of two types or more may be used.

In order to obtain superior masking effects and color reproduction, the amount of colorant included in the ink composition is preferably from 1 to 20% by mass of the total mass thereof (100%).

Dispersing Agents

If the ink composition of this embodiment contains a pigment, a dispersing agent may be further contained in order to further improve pigment dispersibility. There is no particular limitation upon the dispersing agent used; for example, a polymeric dispersing agent or other dispersing agent commonly employed in preparing pigment dispersions may be used. Specific examples include agents containing at least one of polyoxyalkylene polyalkylene polyamine, a vinyl polymer or copolymer, an acrylic polymer or copolymer, a polyester, a polyamide, a polyimide, a polyurethane, an amino polymer, a silicon-containing polymer, a sulfur-containing polymer, a fluorine-containing polymer, and an epoxy resin as a primary component. Examples of commercially available polymeric dispersing agents include the Ajisper Series, produced by Ajinomoto Fine-Techno Co., Inc.; the Solsperse Series (Solsperse 36000, etc.) available from Avecia Co.; the Disperbyk Series produced by BYK K.K.; and the Disparlon Series produced by Kusumoto Chemicals, Ltd.

Slip Agents

The ink composition of this embodiment may include a slip agent, which is a type of surfactant, in order to improve friction resistance in the cured ink. There is no particular limitation upon the slip agent used; for example, a silicone-based surfactant such as polyester-modified silicone or polyether-modified silicone can be used; with a polyether-modified polydimethyl siloxane or polyester-modified polydimethyl siloxane being especially preferable. Specific examples include BYK-347, BYK-348, and BYK-UV3500, 3510, 3530, and 3570 (all produced by BYK K.K.).

Other Additives

The ink composition of this embodiment may include an additive (component) other than the additives given above. There is no particular limitation upon such components; the use of, for example, a known polymerization accelerator, penetration enhancer, or wetting agent (humectant), or other type of additive, is possible. Examples of such other additives include known fixatives, anti-mold agents, preservatives, antioxidants, radiation absorbers, chelating agents, pH adjusting agents, and thickening agents.

Figure 4A:
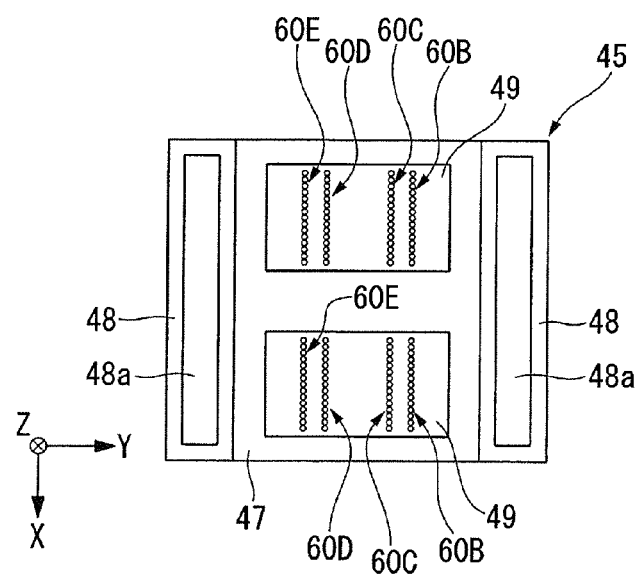
FIG. 4A is an illustration of a head unit.

FIG. 4A is a schematic overhead view of a head unit. As illustrated in FIG. 4A, two droplet ejection heads 49 are disposed with an interval therebetween in the secondary scanning direction (X direction) on the head unit 47, and a nozzle plate 51 (see FIG. 4B) is disposed on the surface of each droplet ejection head 49. A plurality of nozzles 52 are disposed in rows on each nozzle plate 51. In this embodiment, nozzle rows 60b through 60e of 15 nozzles 52 are disposed arranged along the secondary scanning direction with gaps therebetween in the Y direction on each nozzle plate 51. The nozzle rows 60b through 60e disposed on the two droplet ejection heads 49 are disposed along straight lines in the X direction. Nozzle rows 60b and 60e are disposed at equal distances from the center of the carriage 45 with respect to the Y direction. Likewise, nozzle rows 60c and 60d are disposed at equal distances from the center of the carriage 45 with respect to the Y direction. Thus, the distance between the curing units 48 and nozzle row 60b in the positive Y direction is equal to the distance between the curing units 48 and nozzle row 60e in the negative Y direction. Likewise, the distance between the curing units 48 and nozzle row 60c in the positive Y direction is equal to the distance between the curing units 48 and nozzle row 60d in the negative Y direction.

Figure 4B:
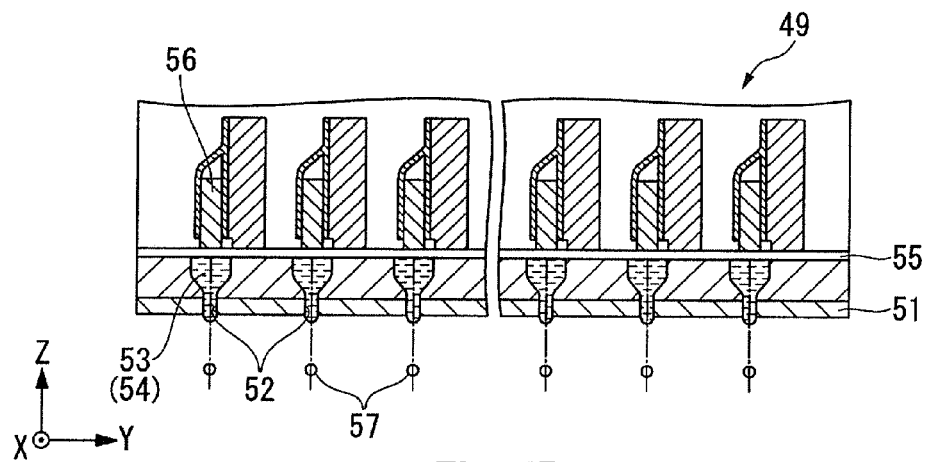
FIG. 4B is an illustration of the structure of a droplet ejection head.

FIG. 4B is a schematic cross-section of the primary parts for describing the construction of a droplet ejection head. As shown in FIG. 4B, the droplet ejection heads 49 has a nozzle plate 51, and nozzles 52 are formed on the nozzle plate 51. Cavities 53 communicating with the nozzles 52 are formed on the upper side of the nozzle plate 51 in positions corresponding to the nozzles 52. Functional fluid 54 is supplied to the cavities 53 of the droplet ejection heads 49.

A vibrational plate 55 that vibrates up and down, and expands and contracts the volume of the cavities 53, is provided on an upper side of the cavities 53. Piezoelectric elements 56 that expand and contract vertically and vibrate the vibrational plate 55 are disposed on an upper side of the vibrational plate 55 in positions corresponding to the cavities 53. The piezoelectric elements 56 expand and contract vertically, placing pressure on the vibrational plate 55 and causing it to vibrate, and the vibrational plate 55 expands and contracts the volumes of the cavities 53, placing pressure upon the cavities 53. This causes the pressure within the cavities 53 to vary, and the functional fluid 54 within the cavities 53 to be ejected through the nozzles 52.

As shown in FIGS. 3B and 4A, the curing units 48 are disposed on either side of the head unit 47 in the primary scanning direction (relative movement direction). Within the curing units 48 are disposed irradiating devices that cure the ejected droplets using ultraviolet light irradiation. Each irradiating device is constituted by a light-emitting unit and a heat sink. A plurality of LED (light emitting diode) elements are arrayed upon the light-emitting unit. The LED elements receive power and emit ultraviolet radiation in the form of ultraviolet light. An irradiation aperture 48a is formed on the underside of the curing unit 48. The ultraviolet light emitted by the irradiating device radiates through the irradiation aperture 48a onto the semiconductor substrate 1.

When the droplet ejection head 49 receives a nozzle drive signal for driving the piezoelectric elements 56, the piezoelectric elements 56 expand, and the vibrational plate 55 decreases the volume of the cavities 53. As a result, an amount of the functional fluid 54 equal to the amount of volume decrease is ejected from the nozzles 52 of the droplet ejection heads 49 in the form of droplets 57. After the functional fluid 54 has been applied thereto, the semiconductor substrate 1 is irradiated with ultraviolet light from the irradiation aperture 48a, so the functional fluid 54, which contains a curing agent, solidifies or cures.

Storage Unit

Figure 5A:
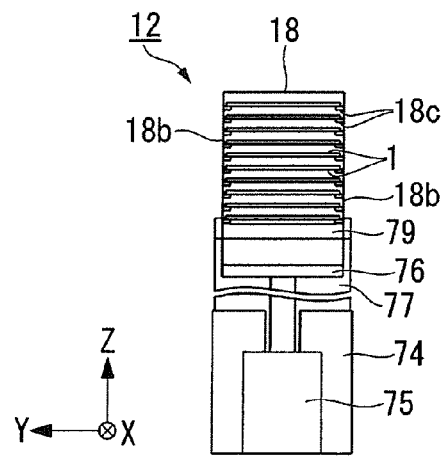
FIGS. 5A to 5C are schematic illustrations of a storage unit.
Figure 5B:
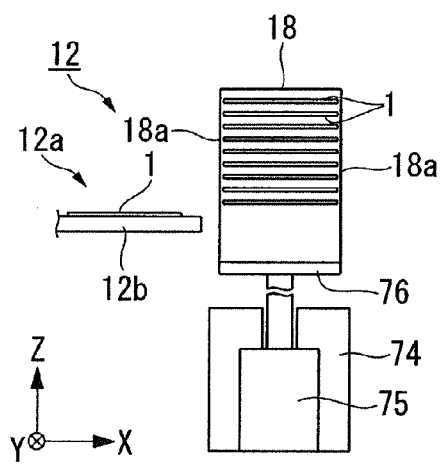
Figure 5C:
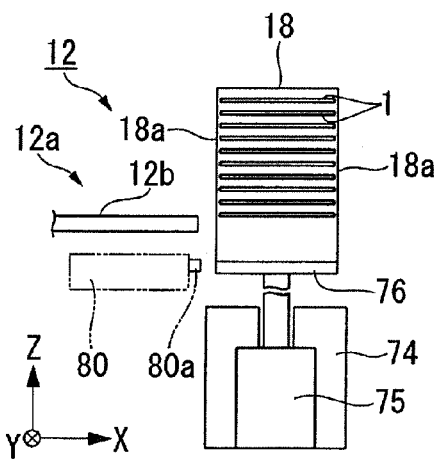

FIG. 5A is a schematic front view of a storage unit, and FIGS. 5B and 5C are schematic side views of a storage unit. As shown in FIGS. 5A and 5B, the storage unit 12 has a base 74. A lift device 75 is provided within the base 74. A device similar to that used for the lift device 16 provided in the feeding part 8 can be used for the lift device 75. A lift platform 76 connected to the lift device 75 is provided on an upper side of the base 74. The lift platform 76 is raised and lowered by the lift device 75. A cuboidal container 18 is provided above the lift platform 76, inside of which is contained a semiconductor substrate 1. The container 18 is the same container 18 as provided in the feeding part 8.

A semiconductor substrate 1 placed on the relay position formed by the rails 12b by the transporting part 13 is carried from the rails 12b to the container 18 by the transporting part 13. Alternatively, a configuration such as that shown in FIG. 5C may be adopted wherein, for example, an ejector 80 having the same configuration as the ejector 23 above is provided underneath the rails 12b and positioned between the two rails 12b in the Y direction and is capable, by means of a lift device not shown in the drawings, of rising to a position level with the semiconductor substrate 1 after the semiconductor substrate 1 has been transported by the transporting part 13 from the rails 12b halfway to the container 18; and, when the transporting part 13 places the semiconductor substrate 1 on the rails 12b, the ejector 80 waits underneath the rails 12b, and, after the transporting part 13 has withdrawn from the rails 12b, the ejector 80 is raised to face the side of the semiconductor substrate 1, the semiconductor substrate 1 is moved into the container 18 by an ejector pin 23a that projects in the positive X direction.

After a predetermined number of semiconductor substrates 1 have been stored within the container 18 through repeatedly insertion of semiconductor substrates 1 into the container 18 and moving in the Z direction of the container 18 using the lift device 75 as described above, an operator replaces the container 18 filled with semiconductor substrates 1 with an empty container 18. In this way, an operator is able to collectively transport a plurality of semiconductor substrates 1 to the next process.

Transporting Part

Figure 7:
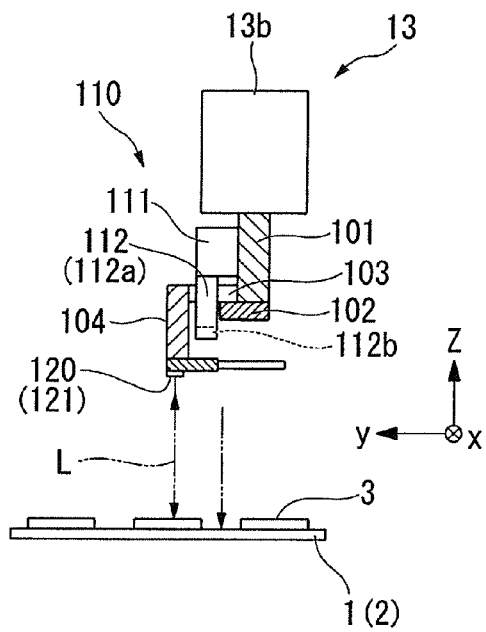
FIG. 7 is an illustration of a detection light being shone upon a semiconductor substrate 1 by a detection device.

Next, a transporting part 13 for transporting the semiconductor substrate 1 will be described with reference to FIGS. 1, 6, and 7.

The transporting part 13 has a support 83 provided on a ceiling of the device interior, with a rotation mechanism formed from a motor, an angle detector, a decelerator, and the like provided within the support 83. An output shaft of the motor is connected to the decelerator, and an output shaft of the decelerator is connected to a first arm 84 disposed underneath the support 83. The angle detector is coupled to the output shaft of the motor, and the angle detector detects the angle of rotation of the output shaft of the motor. In this way, the rotation mechanism is capable of detecting the angle of rotation of the first arm 84, and rotating to a desired angle.

A rotation mechanism 85 is provided on the first arm 84 on an end opposite to the support 83.

The rotation mechanism 85 is constituted by a motor, an angle detector, a decelerator, and the like, and has a function similar to that of the rotation mechanism provided in the support 83. An output shaft of the rotation mechanism 85 is connected to a second arm 86. In this way, the rotation mechanism 85 is capable of detecting the angle of rotation of the second arm 86, and rotating to a desired angle.

A lift device 87 is provided on the second arm 86 on an end opposite to the rotation mechanism 85. The lift device 87 has a direct actuation mechanism, and is capable of extending and retracting by driving the direct actuation mechanism. A mechanism similar to that of, for example, the lift device 16 of the feeding part 8 may be used for the direct actuation mechanism.

FIG. 6A is a frontal view of a gripper 13a disposed on a negative Z direction side of an arm 13b, FIG. 6B is an overhead view of the same (omitting the arm 13b), and FIG. 6C is a left side view of the same.

As the gripper 13a is provided so as to be rotatable in the θZ direction (the direction around the Z axis) with respect to the arm 13b, and its position in the XY plane varies, for convenience of description, one direction parallel with the XY plane will be referred to as the X direction, and a direction parallel with the XY plane and perpendicular to the X direction will be referred to as the Y direction (Z direction same for both).

The gripper 13a has a fixed part 100 rotatable in the θZ direction with respect to the arm 13b and used in a fixed state when a semiconductor substrate 1 is being gripped, and a moving part 110 freely movable in the Z direction with respect to the fixed part 100.

The primary elements constituting the fixed part 100 are a Z axis member 101, a suspension member 102, a linking member 103, a linkage plate 104, a grip plate 105, and a fork 106. The Z axis member 101 extends in the Z direction and is rotatable about the Z axis around the arm 13b. The suspension member 102 is formed as a strip extending in the X direction, and is fixed to a lower end of the Z axis member 101 in a central position along the X direction. The linkage plate 104 is disposed parallel to the suspension member 102 so as to leave a gap therebetween, and is linked with the suspension member 102 on both ends in the X direction by the linking member 103. The grip plate 105 is formed as a plate extending in the X direction, and, as shown in FIG. 6C, a positive Z direction surface thereof is fixed to the lower side of the linkage plate 104 on an edge thereof in the positive Y direction. Of the positive Z direction surface of the grip plate 105, a negative Y direction edge thereof acts as a gripping surface 105a when a semiconductor substrate 1 is being gripped.

The fork 106 supports from underneath the underside (negative Z direction surface) of the semiconductor substrate 1 gripped by the gripping surface 105a, and a plurality thereof (in this embodiment, four) extending in the Y direction from a negative Y side surface of the grip plate 105 are provided at intervals in the X direction. Even when the length of the semiconductor substrate 1 varies depending according to model, the spacing and number of the forks 106 are such that the substrate is supported at one location along the lengthwise direction, preferably at two locations.

The primary elements constituting the moving part 110 are an ascending/descending part 111 and a grip plate 112. The ascending/descending part 111 is constituted by an air cylinder mechanism or the like, and ascends and descends along the Z axis member 101. The grip plate 112 is capable of ascending and descending integrally with the ascending/descending part 111, is shorter than the gap in the x direction between the two linking members 103, and has a width less than the gap between the suspension member 102 and the linkage plate 104; and is formed from an inserted part 112a inserted movably in the Z direction in the gap between the two linking members 103 and the gap between the suspension member 102 and the linkage plate 104, and a grip plate 112b formed integrally therewith positioned below the inserted part 112a and extending in the X direction for roughly the same length as the grip plate 105 underneath the suspension member 102.

The grip plate 112 constituted by the inserted part 112a and the grip plate 112b move integrally in the Z direction in response to the vertical motion of the ascending/descending part 111. When lowered, the grip plate 112 is capable, along with the grip plate 115, of gripping an end of the semiconductor substrate 1 therebetween; and when raised, the grip plate 112 releases the grip on the semiconductor substrate 1 by separating from the grip plate 115.

By inputting the data output by the detector provided on the transporting part 13 and detecting the position and disposition of the gripper 13a, and driving the rotation mechanism 85 so as to move the gripper 13a to a specific position, it is possible to transport the semiconductor substrate 1 being gripped by the gripper 13a to a specific processing part.

FIG. 8 is a block diagram of a control system of a printing device 7.

As shown in FIG. 8, a controller CONT controls the overall operation of the feeding part 8, pre-processing part 9, application part 10, post-treatment part 14, and storage unit 12 described above. A data storage part 130 is connected to the controller CONT. Data for the pattern formed on the surface 3a of the semiconductor device 3 by the plurality of processing devices of the printing device 7 described above is stored in the data storage part 130.

As an example of such pattern data, a first set of data 131 that forms a pattern with thick lines in one shape and a second set of data 132 that forms a pattern with think lines in the same shape are stored. In this embodiment, the pattern formed by the second set of data 132 is configured so as not to protrude over the edges of the pattern formed by the first set of data 131.

Printing Method

Figure 9:
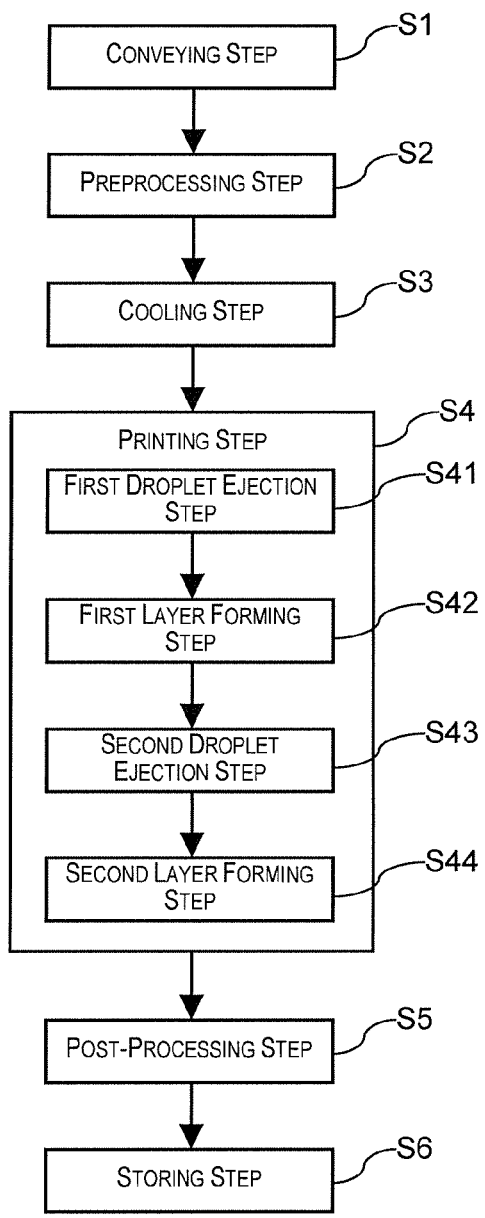
FIG. 9 is a flow chart illustrating a pattern forming method.

Next, a printing method utilizing the above printing device 7 will be described with reference to FIG. 9. FIG. 9 is a flow chart illustrating a printing method.

As illustrated in the flow chart of FIG. 9, the printing method is primarily composed of an conveying step S1 of taking in a semiconductor substrate 1 from a container 18, a pre-processing step S2 of performing pre-processing on the surface of the semiconductor substrate 1 that has been taken in, a cooling step S3 of cooling the semiconductor substrate 1 after being heated during the preceding pre-processing step S2, a printing step S4 of printing various markings on the cooled semiconductor substrate 1, a post-processing step S5 of performing post-processing on the semiconductor substrate 1 printed with the markings, and a storage step S6 of storing the semiconductor substrate 1 after post-processing has been performed within a container 18.

Of the above steps, the printing step S4 is a characteristic of the present invention, and will thus be described below.

The semiconductor substrate 1 upon which pre-processing was performed during the pre-processing step and which was cooled during the cooling step S3 is transported by the transporting part 13 to a stage 39 located at a relay position 10a of the application part 10. During printing step S4, the application part 10 actuates the chuck mechanism to hold the semiconductor substrate 1 resting on the stage 39 in place upon the stage 39.

Next, the application part 10 ejects droplets 57 from the nozzles 52 formed on the droplet ejection heads 49 according to the first set of data 131 stored in the data storage part 130 while moving the stage 39 and the carriage 45 in the scanning direction (first ejection step: S41). Through this, a layer of droplets 57 ejected in the shape of a company logo 4, model code 5, manufacturing number 6, or the like is formed on the surface 3a of the semiconductor device 3, as shown in FIG. 10a. The contact angle of the droplets 57 upon the surface 3a of the semiconductor device 3 at this point will be designated alpha.

After the layer of droplets 57 has been formed, the droplets 57 are irradiated with ultraviolet light by a curing unit 48 provided on the carriage 45. Because the functional fluid 54 constituting the layer of droplets 57 contains a photopolymerization initiator that initiates polymerization in the presence of ultraviolet light, the surface of the layer of droplets is instantly solidified or cured, as shown in FIG. 10b. As a result, a first layer of markings R1 is formed on the surface of the semiconductor device 3 (first layer forming step: S42).

After the first layer of markings R1 has been formed, the application part 10 once again ejects droplets 57 from the nozzles 52 formed on the droplet ejection heads 49 onto the first layer R1 according to the second set of data 132 stored in the data storage part 130 while moving the stage 39 and the carriage 45 in the scanning direction (second ejection step: S43). In this step, because the droplets 57 are ejected according to the second set of data 132, the droplets 57 are disposed so as not to protrude over the edges of the first layer R1. Through this operation, a layer of droplets 57 is formed upon the first layer R1, as shown in FIG. 10c.

In this embodiment, polysiloxane is included in the ink composition as a leveling agent, a type of surfactant. The polysiloxane constitutes from 0.1 to 2% by mass, preferably from 0.12 to 1.6% by mass, of the total mass (100%) of the ink composition. For this reason, as shown in FIG. 10c, the contact angle beta of the droplets 57 with respect to the first layer R1 is greater than the contact angle alpha of the droplets 57 with respect to the surface 3a of the semiconductor device 3. Thus, bleeding of the droplets 57 upon the first layer R1 is prevented.

After the layer of droplets 57 has been formed upon the first layer R1, the droplets 57 are irradiated with ultraviolet light by a curing unit 48 provided on the carriage 45. Because the functional fluid 54 constituting the layer of droplets 57 contains a photopolymerization initiator that initiates polymerization in the presence of ultraviolet light, the surface of the layer of droplets 57 is instantly solidified or cured, as shown in FIG. 10d. As a result, a second layer of markings R2 is formed on the surface of the semiconductor device 3 (second layer forming step: S44).

After the second layer R2 has been formed, the application part 10 moves the stage 39 upon which the semiconductor substrate 1 rests to relay position 10a. This enables the transporting part 13 to more easily grasp the semiconductor substrate 1. Then, the application part 10 stops actuating the chuck mechanism, releasing the grip on the semiconductor substrate 1. Then, in the storage step S6, the semiconductor substrate 1 is transported by the transporting part 13 to the storage unit 12, and stored within the container 18.

Because the ink of this embodiment includes from 0.1 to 2% by mass of polysiloxane, as described above, the contact angle of the first layer R1 and the ink ejected thereupon is greater than that of the surface of the semiconductor device 3 and the ink ejected thereupon. For this reason, it is possible to prevent the second layer R2 from spreading over the first layer R1 when being formed, and to form a second layer R2 that is finer than the first layer R1, as shown, for example, in FIG. 10e. Because the first layer R1 and second layer R2 can be formed three-dimensionally, it is possible to form highly visible, fine patterns.

The technical scope of the present invention is not limited to the above embodiment, and various modifications within the spirit of the present invention may be made.

In the above embodiment, a UV-curable ink was used as the UV ink, but the present invention is not limited to this, and various active light-curable inks using visible light or infrared light to cure can be used.

Likewise, a variety of active light sources emitting visible light or another type of active light, i.e., active light irradiators, may be used.

In the context of the present invention, there is no particular limit upon the "active light" so long as it is capable of imparting energy capable of generating initiating species in the ink via irradiation, and broadly, alpha waves, gamma waves, X-rays, ultraviolet light, visible light, and electron beams are included. Of these, from considerations of curing sensitivity and ease of equipment procurement, ultraviolet light or an electron beam are preferable, and ultraviolet light is especially preferable. As such, it is preferable that the active light-curable ink be a UV-curable ink that cures upon irradiation with ultraviolet light, as in this embodiment.

In the above embodiment, the substrate constituted by the semiconductor substrate 1 was a substrate 2 upon which a semiconductor device 3 was mounted, but a substrate formed from a semiconductor such as silicon is also acceptable. The semiconductor device 3 constituting the recording medium can be a semiconductor device molded from resin, or itself be a semiconductor device.

EXAMPLES

A working example of the present invention will be described below.

In this example, as described in the embodiment above, the following materials were used as ink components, a first layer R1 was formed on the surface 3a of the semiconductor device 3, and a second layer R2 was formed on the first layer R1.

4% by mass of IRGACURE 819 (bis(2,4,6-trimethylbenzoyl)-phenyl phosphine oxide) and 5% by mass of TPO (2,4,6-trimethylbenzoyl-diphenyl-phosphine oxide) were used as photopolymerization initiators.

12% by mass of titanium oxide was used as a pigment.

0.1% by mass of MEHQ (methyl hydroquinone) was used as a polymerization inhibitor.

Polysiloxane and acetylene diol were used as leveling agents.

Suitable masses of VEEA, NVC, PEA, and PETA were used as polymerizing compounds.

Table 1 shows the results yielded by combinations of the above materials.

TABLE 1

|  |  | Working Example 1 | Working Example 2 | Working Example 3 | Working Example 4 | Working Example 5 | Working Example 6 | Working Example 7 | Working Example 8 |
|---|---|---|---|---|---|---|---|---|---|
| Photopolymerization initiator | B19 | 4 | 4 | 4 | 4 | 4 | 4 | 4 | 4 |
|  | TPO | 5 | 5 | 5 | 5 | 5 | 5 | 5 | 5 |
| Pigment | Titanium Oxide | 12 | 12 | 12 | 12 | 12 | 12 | 12 | 12 |
| Polymerization inhibitor | MEHQ | 0.1 | 0.1 | 0.1 | 0.1 | 0.1 | 0.1 | 0.1 | 0.1 |
| Leveling agent | Polysiloxane 1, HLB 9-12 | 0.1 |  |  |  |  |  |  |  |
|  | Polysiloxane 2, HLB 11 |  | 0.1 | 2 |  |  | 0.5 | 0.5 | 0.5 |
|  | Polysiloxane 3, HLB 11 |  |  |  | 0.5 |  |  |  |  |
|  | Polysiloxane 4, HLB 5-8 |  |  |  |  | 0.5 |  |  |  |
|  | Polysiloxane 5, HLB 13-17 |  |  |  |  |  |  |  |  |
|  | Polysiloxane 6, HLB 3 |  |  |  |  |  |  |  |  |
|  | Acetylene diol, HLB 8 |  |  |  |  |  |  |  |  |
| Polymerizing compound | VEEA | 39.6 | 39.6 | 39.6 | 39.6 | 39.6 | 39.6 | 35.0 | 39.6 |
|  | NVC | 8.0 | 8.0 | 8.0 | 8.0 | 8.0 | 8.0 | 8.0 | 8.0 |
|  | PEA | 16.3 | 16.3 | 14.4 | 15.9 | 15.9 | 23.8 | 10.4 | 25.8 |
|  | PETA | 14.9 | 14.9 | 14.9 | 14.9 | 14.9 | 7.0 | 25.0 | 5.0 |
| Total |  | 100.0 | 100.0 | 100.0 | 100.0 | 100.0 | 100.0 | 100.0 | 100.0 |
|  |  | Working | Comparative | Comparative | Comparative | Comparative | Comparative |  |  |

TABLE 1-continued

|  |  | Example 9 | Example 1 | Example 2 | Example 3 | Example 4 | Example 5 |
|---|---|---|---|---|---|---|---|
| Photopolymerization initiator | B19 | 4 | 4 | 4 | 4 | 4 | 4 |
|  | TPO | 5 | 5 | 5 | 5 | 5 | 5 |
| Pigment | Titanium Oxide | 12 | 12 | 12 | 12 | 12 | 12 |
| Polymerization inhibitor | MEHQ | 0.1 | 0.1 | 0.1 | 0.1 | 0.1 | 0.1 |
| Leveling agent | Polysiloxane 1, HLB 9-12 |  |  |  |  |  |  |
|  | Polysiloxane 2, HLB 11 | 0.5 |  |  |  |  |  |
|  | Polysiloxane 3, HLB 11 |  |  |  |  | 0.5 | 3 |
|  | Polysiloxane 4, HLB 5-8 |  |  |  |  |  |  |
|  | Polysiloxane 5, HLB 13-17 |  | 0.5 |  |  |  |  |
|  | Polysiloxane 6, HLB 3 |  |  | 0.5 |  |  |  |
|  | Acetylene diol, HLB 8 |  |  |  | 0.5 |  |  |
| Polymerizing compound | VEEA | 30.0 | 39.6 | 39.6 | 39.6 | 39.6 | 39.6 |
|  | NVC | 8.0 | 8.0 | 8.0 | 8.0 | 8.0 | 8.0 |
|  | PEA | 10.4 | 15.9 | 15.9 | 15.9 | 16.4 | 13.4 |
|  | PETA | 30.0 | 14.9 | 14.9 | 14.9 | 14.9 | 14.9 |
| Total |  | 100.0 | 100.0 | 100.0 | 100.0 | 100.0 | 100.0 |

As shown by working examples 1 through 9 and comparative examples 1 and 2 in Table 1, the contact angle beta of the droplets 57 upon the first layer R1 was greater than the contact angle alpha of the droplets 57 on the surface 3a when from 0.1 to 2% by mass polysiloxane was included. Against this, as shown by comparative examples 3 through 5, when no polysiloxane was included, or when the amount thereof was less than 0.1% by mass or greater than 2% by mass, no particularly noticeable difference between the contact angles alpha and beta was observed. This shows that including from 0.1 to 2% by mass of polysiloxane allows highly visible, fine patterns to be formed.

Also, as shown by working examples 1 through 9, when the HLB value of the polysiloxane is from 5 to 12, the contact angle beta was more noticeably greater than the contact angle alpha. Thus, when the HLB value of the polysiloxane is from 5 to 12, more highly visible, fine patterns can be formed.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A pattern forming method comprising:
   performing a first droplet ejection step by ejecting droplets containing 0.1%-2% polysiloxane by mass and a polymerizing compound onto a substrate, the polymerizing compound including a compound that has a pentaerythritol skeleton;
   performing a first layer forming step by solidifying the droplets ejected onto the substrate so that a first layer is formed;
   performing a second droplet ejection step by ejecting more droplets over the first layer; and
   performing a second layer forming step by solidifying the droplets ejected onto the first layer so that a second layer is formed.

2. The pattern forming method according to claim 1, wherein
   a hydrophilic-lipophilic balance value of the polysiloxane is 5 to 12.

3. The pattern forming method according to claim 1, wherein
   the second droplet ejection step includes ejecting the droplets so that the droplets do not protrude from over the first layer.

4. The pattern forming method according to claim 1, wherein
   the droplets include a component that solidifies under active light, and
   the first layer forming step and the second layer forming step include irradiating the droplets with the active light.

5. The pattern forming method according to claim 4, wherein
   the active light is ultraviolet light.

6. The pattern forming method according to claim 1, wherein the substrate is a semiconductor substrate having a semiconductor device, and the first droplet ejection step includes ejecting droplets on the semiconductor device.

7. The pattern forming method according to claim 1, wherein the polymerizing compound is a 7%-25% polymerizing compound by mass.

* * * * *